US012666565B2

(12) United States Patent
Syu et al.

(10) Patent No.: US 12,666,565 B2
(45) Date of Patent: Jun. 23, 2026

(54) LIQUID COOLING DEVICE FOR CONVENIENT REPLACEMENT OF PUMP

(71) Applicant: Cooltek Inc., Taipei (TW)

(72) Inventors: Wei-En Syu, Taipei (TW); Jia-Xiu Zhou, Guangzhou (CN)

(73) Assignee: COOLTEK INC., Taipei City (TW)

( * ) Notice: Subject to any disclaimer, the term of this patent is extended or adjusted under 35 U.S.C. 154(b) by 183 days.

(21) Appl. No.: 18/429,038

(22) Filed: Jan. 31, 2024

(65) Prior Publication Data

US 2025/0048586 A1 Feb. 6, 2025

(30) Foreign Application Priority Data

Aug. 4, 2023 (TW) ................................. 112129265

(51) Int. Cl.
*H05K 7/20* (2006.01)

(52) U.S. Cl.
CPC ..... *H05K 7/20254* (2013.01); *H05K 7/20272* (2013.01)

(58) Field of Classification Search
CPC ........... H05K 7/20254; H05K 7/20781; H05K 7/20272; H05K 7/20772; H05K 7/20327; H01L 23/473; H01L 23/46; F28F 2250/08
See application file for complete search history.

(56) References Cited

U.S. PATENT DOCUMENTS

| | | | | |
|---|---|---|---|---|
| 8,051,898 B2 * | 11/2011 | Chiang | ................. | H01L 23/473 |
| | | | | 417/313 |
| 8,631,860 B2 * | 1/2014 | Tang | ...................... | B65D 51/16 |
| | | | | 137/565.17 |
| 9,666,913 B2 * | 5/2017 | Elsaesser | ............ | H01M 10/625 |
| 2006/0185829 A1 * | 8/2006 | Duan | .................... | H01L 23/473 |
| | | | | 257/E23.098 |
| 2009/0159244 A1 * | 6/2009 | Mounioloux | ............. | G06F 1/20 |
| | | | | 165/104.33 |
| 2012/0152498 A1 * | 6/2012 | Lyon | ..................... | H01L 23/473 |
| | | | | 165/104.19 |
| 2013/0299139 A1 * | 11/2013 | Mounioloux | ......... | H01L 23/467 |
| | | | | 165/120 |
| 2016/0363967 A1 * | 12/2016 | Tsai | ................... | H05K 7/20272 |

(Continued)

FOREIGN PATENT DOCUMENTS

TW M508705 9/2015

Primary Examiner — Adam B Dravininkas
(74) *Attorney, Agent, or Firm* — MUNCY, GEISSLER, OLDS & LOWE, P.C.

(57) ABSTRACT

A liquid cooling device for convenient replacement of a pump comprises a heat exchange block and the pump. The block has a body, two pipe connection ports formed on the body, a heat exchange chamber formed in the body, a passage formed in the body and separated from the chamber, a first pump installation port and a second pump installation port formed on the body. One of the two pipe connection ports forms a first waterway with the passage and the first pump installation port, the other pipe connection port forms a second waterway with the chamber and the second pump installation port. The pump is attached on the block, and has a casing and two pump connection ports located on the casing, the pump connection ports are respectively connected to the first and second pump installation ports, and the pump is connected to the first and second waterways.

9 Claims, 8 Drawing Sheets

(56) References Cited

U.S. PATENT DOCUMENTS

2017/0367217 A1* 12/2017 Xiao ..................... H01L 23/467
2022/0243735 A1* 8/2022 Kitamura .............. F04D 29/586
2023/0056832 A1* 2/2023 Tsai ......................... G06F 1/20

* cited by examiner

LIQUID COOLING DEVICE FOR CONVENIENT REPLACEMENT OF PUMP

FIELD OF THE INVENTION

The invention relates to a liquid cooling device, and more particularly to a liquid cooling device with a pump attached and convenient for replacement of the pump.

BACKGROUND OF THE INVENTION

TWM508705 discloses a liquid cooling heat dissipation structure. The liquid cooling heat dissipation structure comprises a heat dissipation module and a water supply module. The water supply module comprises an outer cover disposed on the heat dissipation module and at least one pump disposed in the outer cover. An internal space of the outer cover is divided into a first independent space adjacent to the heat dissipation module and a second independent space away from the heat dissipation module and not communicated with the first independent space. The pump comprises a stator disposed in the first independent space and a rotor disposed in the second independent space, and the rotor is located closer to the heat dissipation module than the rotor.

The outer cover of the water supply module needs to cooperate with an exterior of the heat dissipation module to form a space for disposing the pump. That is to say, the water supply module does not have an independent shell. Therefore, such a design will not be conducive to replacement of the pump.

SUMMARY OF THE INVENTION

A main object of the invention is to solve the problem that the conventional structure is not conducive to subsequent replacement or maintenance.

In order to achieve the above object, the invention provides a liquid cooling device for convenient replacement of a pump, comprising a heat exchange block and a pump. The heat exchange block includes a body, two pipe connection ports formed on the body, a heat exchange chamber formed in the body, a passage formed in the body and separated from the heat exchange chamber, a first pump installation port formed on the body, and a second pump installation port formed on the body. One of the two pipe connection ports forms a first waterway with the passage and the first pump installation port, and the other one of the two pipe connection ports forms a second waterway with the heat exchange chamber and the second pump installation port. The pump is attached on the heat exchange block, the pump includes a casing separable from the body relatively, and two pump connection ports located on the casing, the two pump connection ports are respectively connected to the first pump installation port and the second pump installation port, and the pump is connected to the first waterway and the second waterway.

In one embodiment, the heat exchange block includes a heat conduction plate provided on the body, and a heat conduction fins set provided on the heat conduction plate. The heat exchange chamber comprises a passageway connected to the second pump installation port, and a working space provided for disposing of the heat conduction fins set therein, and the passageway communicates with the working space above a center of the heat conduction fins set.

In one embodiment, the heat exchange block includes a partition plate disposed of in the heat exchange chamber and layered between the passageway and the working space. The partition plate has a first through hole located above the center of the heat conduction fins set.

In one embodiment, the heat exchange block includes at least one deflector disposed between the partition plate and the heat conduction fins set, and the at least one deflector includes a diversion slit communicated with the first through hole.

In one embodiment, the partition plate includes a plurality of limiting blocks located in the working space to limit a position of the at least one deflector.

In one embodiment, the liquid cooling device includes a bracket for assisting in fixing the pump to the heat exchange block.

In one embodiment, the bracket is integrally formed with the casing of the pump.

In one embodiment, the pump includes a driving member disposed of in the casing, and an impeller connected to the driving member. The casing includes two half shells, one of the two half shells is formed with the two pump connection ports and provided for disposing of the impeller therein, and the other one of the two half shells is provided for disposing of the driving member therein.

In one embodiment, the pump includes a diversion member disposed of in one of the two half shells formed with the two pump connection ports, the diversion member in one of the two half shells defines two chambers respectively communicated with one of the two pump connection ports, the diversion member includes a second through hole communicated with the two chambers, and the impeller is located in one of the two chambers.

Through the foregoing implementation of the invention, compared with the prior art, the invention has the following characteristics: since the casing of the pump of the invention is independent of the body of the heat exchange block, when the pump needs to be repaired or replaced with another pump with different specifications, the two pump connection ports of the pump only need to be separated from the first pump installation port and the second pump installation port, and relevant operations can be performed without disassembling the body. In addition, a design of the first waterway and the second waterway in the heat exchange block of the invention is also a major reason why the pump can be easily replaced.

DETAILED DESCRIPTION OF THE PREFERRED EMBODIMENTS

Figure 1:
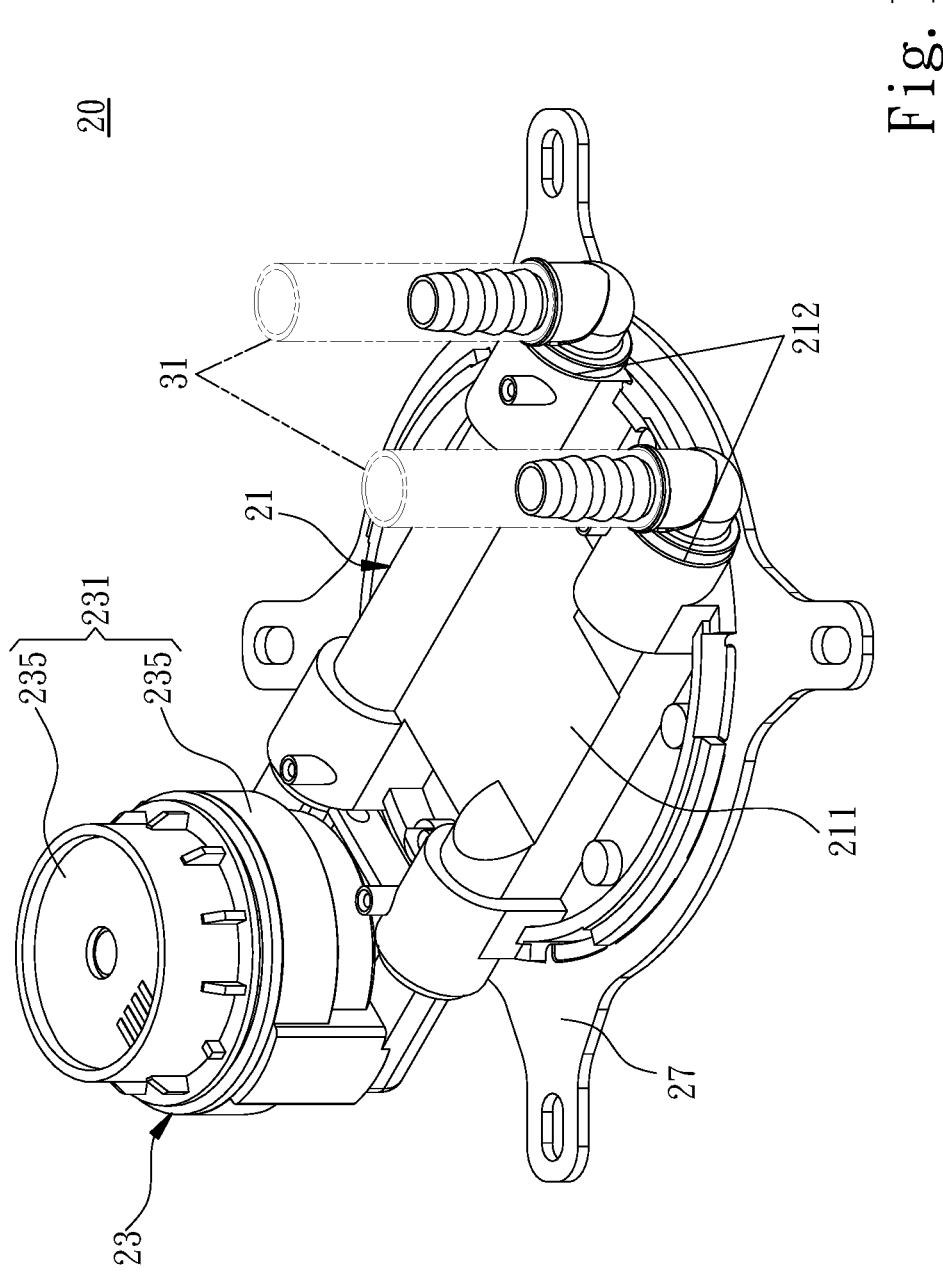
FIG. 1 is a first perspective view of structures of a liquid cooling device of the invention.

The detailed description and technical content of the invention are described below with reference to the accompanying drawings.

Please refer to FIG. 1, FIG. 2, FIG. 3, FIG. 4 and FIG. 5. The invention provides a liquid cooling device 20. The liquid cooling device 20 contacts a to-be-dissipated component 30 to dissipate waste heat generated when the to-be-dissipated component 30 is activated so as to dissipate heat of the to-be-dissipated component 30. The to-be-dissipated component 30 can be a central processing unit (CPU), a graphics processing unit (GPU), a memory or a solid-state drive, etc. The liquid cooling device 20 comprises a heat exchange block 21 and a pump 23, wherein the heat exchange block 21 includes a body 211, two pipe connection ports 212 formed on the body 211, a heat exchange chamber 213 formed in the body 211, a passage 214 formed in the body 211 and separated from the heat exchange chamber 213, a first pump installation port 215 formed on the body 211, and a second pump installation port 216 formed on the body 211. In addition, one of the two pipe connection ports 212 forms a first waterway 24 with the passage 214 and the first pump installation port 215, and the other one of the two pipe connection ports 212 forms a second waterway 25 with the heat exchange chamber 213 and the second pump installation port 216. Furthermore, the two pipe connection ports 212 are respectively connected to two liquid conduits 31, and the two liquid conduits 31 can be connected to a heat dissipation radiator (not shown in the figures), so that the liquid cooling device 20, the two liquid conduits 31 and the heat dissipation radiator form a closed heat dissipation circulation system.

Figure 2:
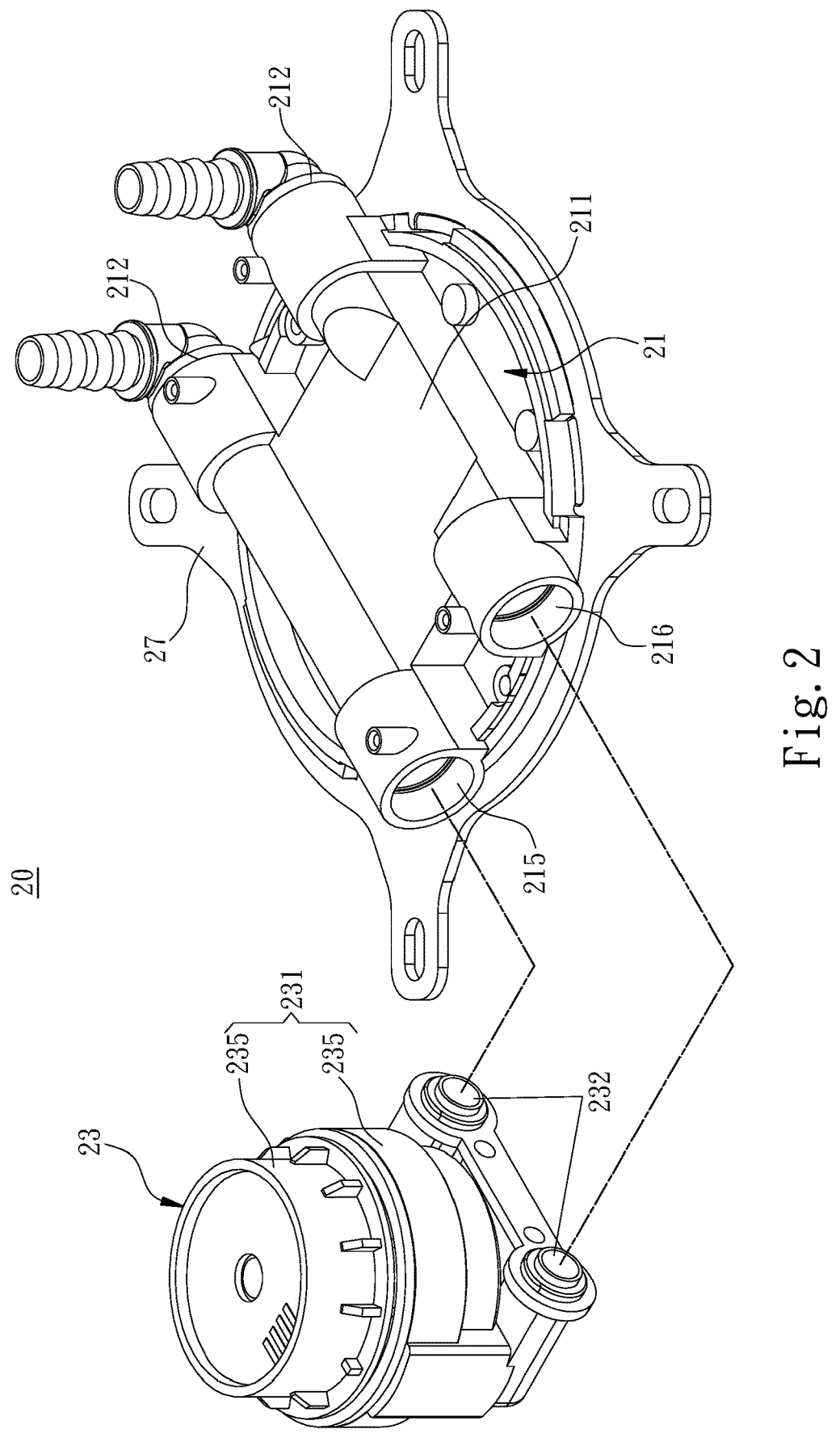
FIG. 2 is an exploded perspective view of structures of the liquid cooling device of the invention.
Figure 3:
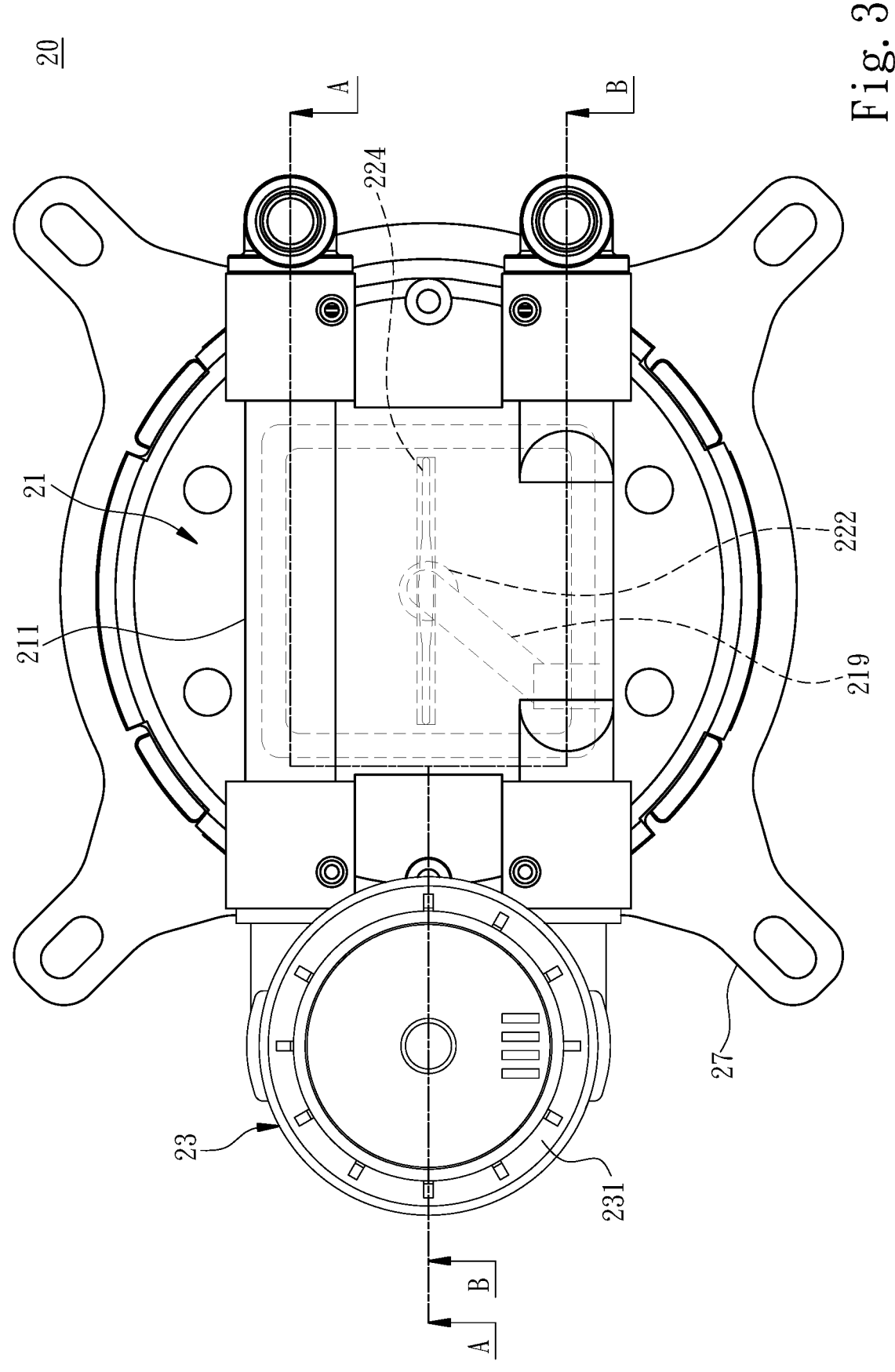
FIG. 3 is a top view of structures of the liquid cooling device of the invention.
Figure 4:
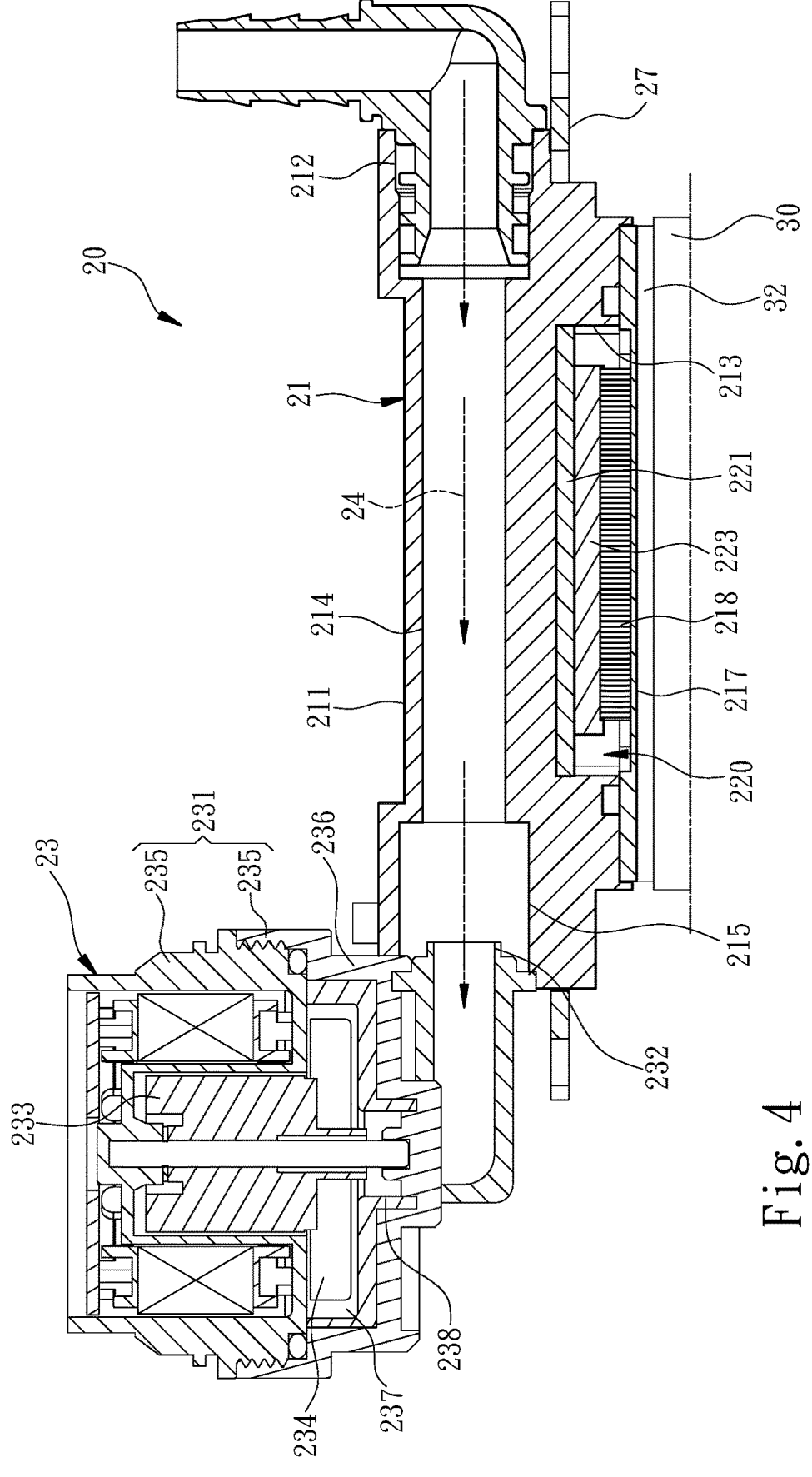
FIG. 4 is a structural cross-sectional view of line segment A-A in FIG. 3.

Please refer to FIG. 2, FIG. 3, FIG. 4, and FIG. 5 again. The pump 23 is attached on the heat exchange block 21. The pump 23 includes a casing 231 separable from the body 211 relatively, and two pump connection ports 232 located on the casing 231. The pump 23 connects with the first waterway 24 and the second waterway 25 for a working fluid in either the first waterway 24 flowing to the second waterway 25 or in the second waterway 25 flowing to the first waterway 24, through the pump 23. It should be understood that the heat exchange block 21 of the invention uses one of the two pipe connection ports 212 as an inlet of the working fluid, and the other one of the two pipe connection ports 212 as an outlet of the working fluid for the working fluid flowing in the first waterway 24 and the second waterway 25 in a one-way path. In one embodiment, a path of the working fluid in the heat exchange block 21 is in a sequence of: one of the two pipe connection ports 212, the passage 214, the first pump installation port 215, the pump 23, the second pump installation port 216, the heat exchange chamber 213, and the other one of the two pipe connection ports 212. The pump 23 of the invention is designed to be attached on the heat exchange block 21, and the casing 231 of the pump 23 is independent of the body 211 of the heat exchange block 21 so that the casing 231 does not need to cooperate with the body 211 to define a space required. According to the invention, the pump 23 can be replaced by separating the two pump connection ports 232 of the pump 23 from the first pump installation port 215 and the second pump installation port 216 without disassembling the body 211. During operations of maintenance or replacement of the pump 23 with different specifications, the pump 23 can be assembled according to implementation requirements to reduce a degree of being restricted by other structures.

Please refer to FIG. 3, FIG. 4, FIG. 5, and FIG. 6. The heat exchange block 21 includes a heat conduction plate 217 provided on the body 211, and a heat conduction fins set 218 provided on the heat conduction plate 217 and located in the heat exchange chamber 213. The heat exchange block 21 forms heat conduction through the heat conduction plate 217 and the to-be-dissipated component 30. A heat conduction paste layer 32 can be disposed between the heat conduction plate 217 and the to-be-dissipated component 30. In addition, the heat conduction plate 217 and the heat conduction fins set 218 can be integrally formed or formed into one component through machining. The heat conduction plate 217 and the heat conduction fins set 218 are both made of metal and have good thermal conductivity. In one embodiment, the heat conduction plate 217 and the heat conduction fins set 218 can be implemented with copper respectively. The heat conduction fins set 218 comprise a plurality of thermally conductive fins disposed at intervals, and directions and positions of the plurality of thermally conductive fins are determined by a flow path formed in the heat exchange chamber 213. On the other hand, the heat exchange chamber 213 comprises a passageway 219 connected to the second pump installation port 216, and a working space 220 provided for disposing of the heat conduction fins set 218 therein. The passageway 219 is connected with a beginning of the second waterway 25, and the passageway 219 and the working space 220 are layered structures, the passageway 219 is located on an upper layer above the working space 220. One end of the passageway 219 is connected to the second pump installation port 216, and the other end of the passageway 219 is communicated with the working space 220 above a center of the heat conduction fins set 218. Thereby, a heat dissipation efficiency of the heat conduction plate 217 can be improved. On the other hand, the working space 220 is communicated with one of the two pipe connection ports 212.

Figure 5:
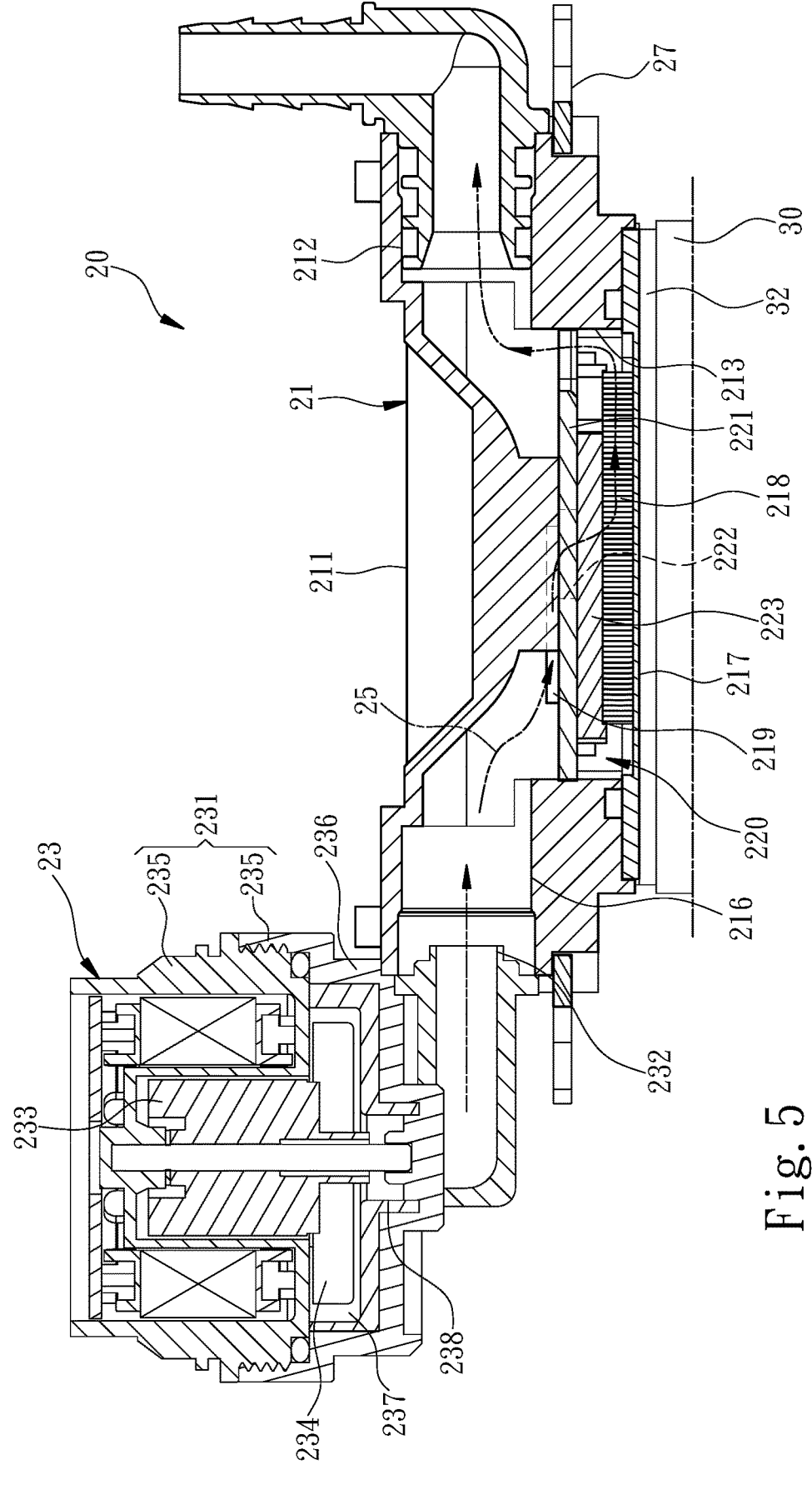
FIG. 5 is a structural cross-sectional view of line segment B-B in FIG. 3.
Figure 6:
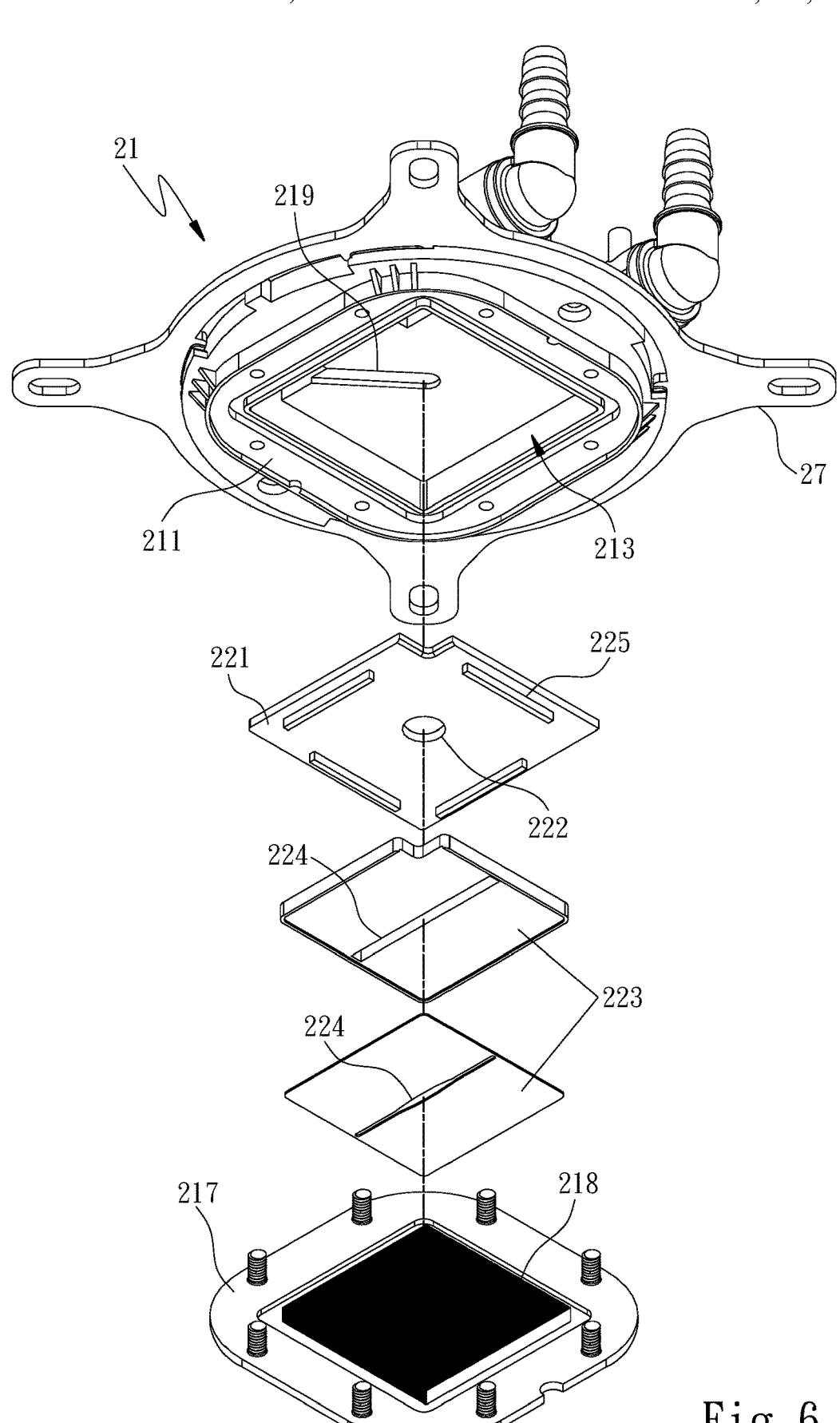
FIG. 6 is an exploded perspective view of structures of a heat exchange block of the invention.

Please refer to FIG. 3, FIG. 4, FIG. 5, and FIG. 6 again. In one embodiment, the heat exchange block 21 includes a partition plate 221 disposed in the heat exchange chamber 213 and layered between the passageway 219 and the working space 220. The partition plate 221 includes a first through hole 222 located above the center of the heat conduction fins set 218, and the first through hole 222 is provided for communicating the passageway 219 with the working space 220. In one embodiment, the heat exchange block 21 includes at least one deflector 223 disposed between the partition plate 221 and the heat conduction fins set 218, and the at least one deflector 223 includes a diversion slit 224 communicated with the first through hole 222. The diversion slit 224 is elongated, and a length of the diversion slit 224 is greater than a diameter of the first through hole 222, but a widest part of the diversion slit 224 can be smaller than the diameter of the first through hole 222. Furthermore, a disposal direction of the diversion slit 224 is orthogonal to disposal directions of the plurality of thermally conductive fins. Further, when a plurality of deflectors 223 are provided in the heat exchange block 21, the plurality of deflectors 223 are overlapped with one another, and shapes and forms of a plurality of diversion slits 224 are not limited to being the same, but the plurality of diversion slits 224 are substantially overlapped with one another. Please refer to FIG. 6, in one embodiment, the partition plate 221 includes a plurality of limiting blocks 225 located in the working space 220 to limit a position of the at least one deflector 223. The plurality of limiting blocks 225 are distributed on a side of the partition plate 221 facing the heat conduction fins set 218.

Figure 7:
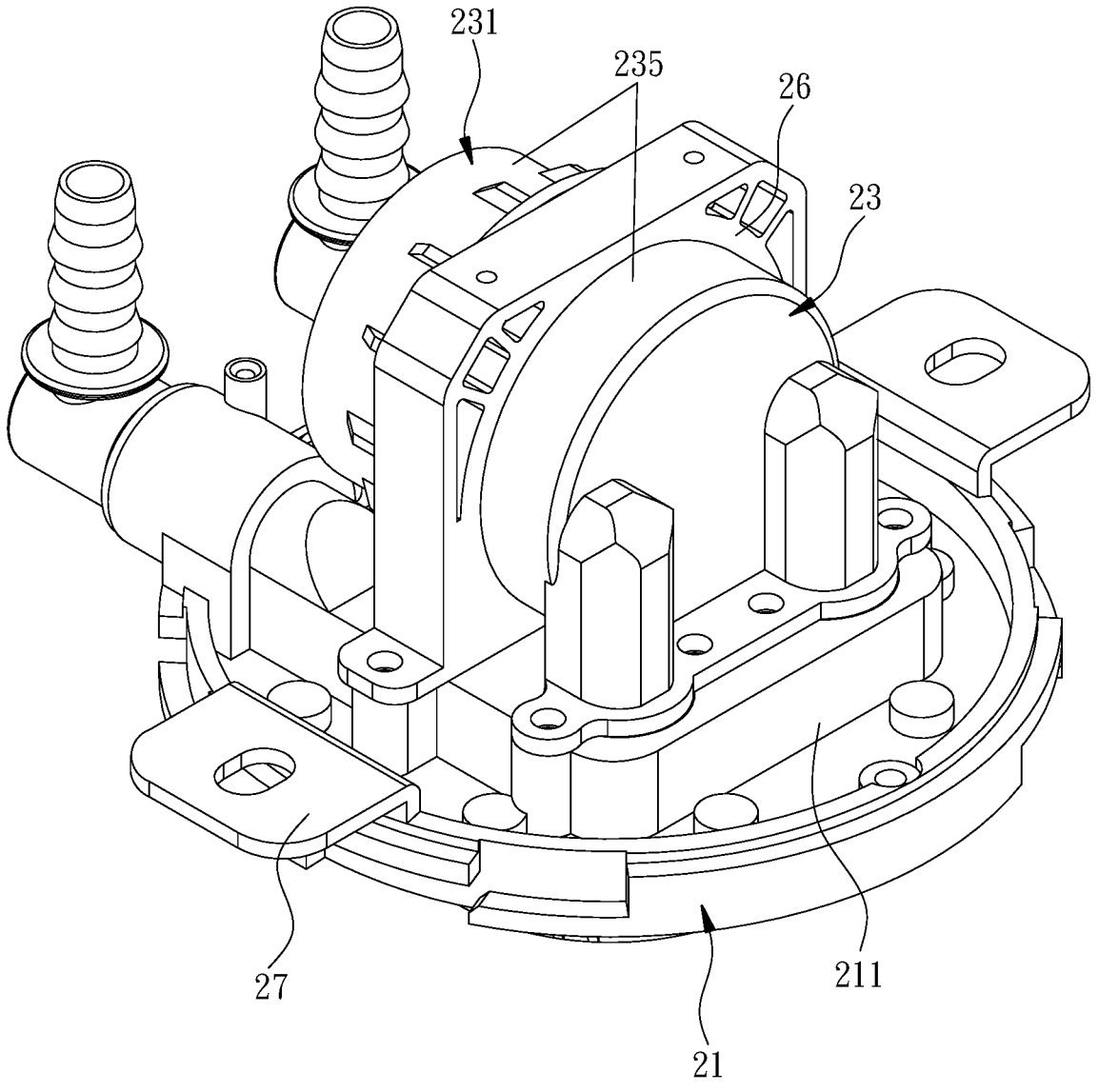
FIG. 7 is a second perspective view of structures of the liquid cooling device of the invention.

In addition to relative positions of the pump 23 and the heat exchange block 21 as shown in FIG. 1, the pump 23 can also be located above the heat exchange block 21, as shown in FIG. 7. In order to facilitate replacement of the pump 23, even though the pump 23 is located above the heat exchange block 21, the pump 23 does not need to cooperate with the body 211 to form a space required for implementation. In one embodiment, the liquid cooling device 20 includes a bracket 26 for assisting in fixing the pump 23 to the heat exchange block 21. The bracket 26 can be integrally formed with the casing 231 of the pump 23.

Figure 8:
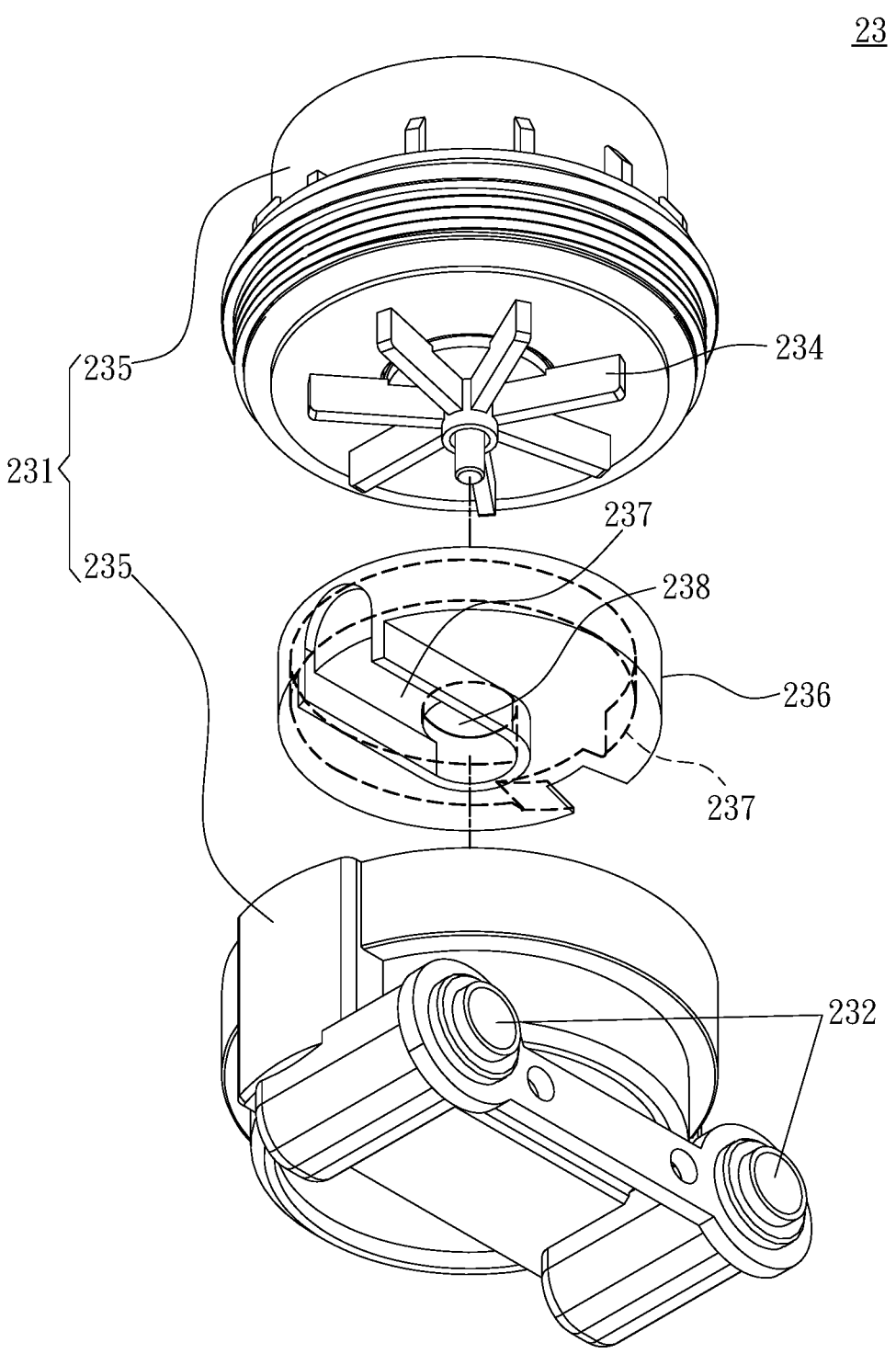
FIG. 8 is an exploded perspective view of structures of a pump of the invention.

Please refer to FIG. 4, FIG. 5 and FIG. 8. In one embodiment, the pump 23 includes a driving member 233 provided in the casing 231, and an impeller 234 connected to the driving member 233. The casing 231 includes two half shells 235, one of the two half shells 235 is formed with the two pump connection ports 232 and provided for accommodating of the impeller 234 therein, and the other one of the two half shells 235 is provided for disposing of the driving member 233 therein. In one embodiment, the pump 23 further includes a diversion member 236 disposed in one of the two half shells 235 formed with the two pump connection ports 232. The diversion member 236 in one of the two half shells 235 defines two chambers 237 respectively communicated with one of the two pump connection ports 232, the diversion member 236 includes a second through hole 238 communicated with the two chambers 237, and the impeller 234 is located in one of the two chambers 237.

Please refer to FIG. 1 and FIG. 7. The liquid cooling device 20 of the invention can further include a fastener 27, and types of the fastener 27 are not limited. An object of the fastener 27 is to make the liquid cooling device 20 securely contact the to-be-dissipated component 30.

What is claimed is:

1. A liquid cooling device for convenient replacement of a pump, comprising:

a heat exchange block comprising a body, two pipe connection ports formed on the body, a heat exchange chamber formed in the body without assembling, a passage formed in the body without assembling and separated from the heat exchange chamber, a first pump installation port formed on the body, and a second pump installation port formed on the body, one of the two pipe connection ports forming a first waterway with the passage and the first pump installation port, the other one of the two pipe connection ports forming a second waterway with the heat exchange chamber and the second pump installation port; and a pump attached on the heat exchange block, the pump comprising a casing separable from the body relatively, and two pump connection ports located on the casing, the two pump connection ports respectively connected to the first pump installation port and the second pump installation port, and the pump connected to the first waterway and the second waterway, wherein the pump is selectively separable from the body of the heat exchange block by disengaging the two pipe connection ports from the first pump installation port and the second pump installation port.

2. The liquid cooling device for convenient replacement of the pump as claimed in claim 1, wherein the heat exchange block comprises a heat conduction plate provided on the body, and a heat conduction fins set provided on the heat conduction plate, the heat exchange chamber comprises a passageway connected to the second pump installation port, and a working space provided for disposing of the heat conduction fins set therein, and the passageway communicates with the working space above a center of the heat conduction fins set.

3. The liquid cooling device for convenient replacement of the pump as claimed in claim 2, wherein the heat exchange block comprises a partition plate disposed in the heat exchange chamber and layered between the passageway and the working space, and the partition plate comprises a first through hole located above the center of the heat conduction fins set.

4. The liquid cooling device for convenient replacement of the pump as claimed in claim 3, wherein the heat exchange block comprises at least one deflector disposed between the partition plate and the heat conduction fins set, and the at least one deflector comprises a diversion slit communicated with the first through hole.

5. The liquid cooling device for convenient replacement of the pump as claimed in claim 4, wherein the partition plate comprises a plurality of limiting blocks located in the working space to limit a position of the at least one deflector.

6. The liquid cooling device for convenient replacement of the pump as claimed in claim 1, wherein the liquid cooling device comprises a bracket for assisting in fixing the pump to the heat exchange block.

7. The liquid cooling device for convenient replacement of the pump as claimed in claim 6, wherein the bracket is integrally formed with the casing of the pump.

8. The liquid cooling device for convenient replacement of the pump as claimed in claim 1, wherein the pump comprises a driving member disposed in the casing, and an impeller connected to the driving member, the casing comprises two half shells, one of the two half shells is formed with the two pump connection ports and provided for disposing of the impeller therein, and the other one of the two half shells is provided for disposing of the driving member therein.

9. The liquid cooling device for convenient replacement of the pump as claimed in claim 8, wherein the pump comprises a diversion member disposed of in one of the two half shells formed with the two pump connection ports, the diversion member in one of the two half shells defines two chambers respectively communicated with the two pump connection ports, the diversion member comprises a second through hole communicated with the two chambers, and the impeller is located in one of the two chambers.

\* \* \* \* \*